(12) United States Patent
Yeh et al.

(10) Patent No.: US 12,217,993 B2
(45) Date of Patent: Feb. 4, 2025

(54) WAFER NOTCH AUTOMATED ALIGNER

(71) Applicant: National Tsing Hua University, Hsinchu (TW)

(72) Inventors: Wei-Chang Yeh, Hsinchu (TW); Shi-Yi Tan, Hsinchu (TW)

(73) Assignee: NATIONAL TSING HUA UNIVERSITY, Hsinchu (TW)

( * ) Notice: Subject to any disclaimer, the term of this patent is extended or adjusted under 35 U.S.C. 154(b) by 666 days.

(21) Appl. No.: 17/519,382

(22) Filed: Nov. 4, 2021

(65) Prior Publication Data
US 2023/0084179 A1    Mar. 16, 2023

(30) Foreign Application Priority Data

Sep. 15, 2021 (TW) ................................. 110134428

(51) Int. Cl.
*H01L 21/68* (2006.01)
*B65G 47/90* (2006.01)

(52) U.S. Cl.
CPC .............. *H01L 21/68* (2013.01); *B65G 47/90* (2013.01)

(58) Field of Classification Search
CPC ............. H01L 2224/93; H01L 2224/94; H01L 21/67259; H01L 21/67265

USPC .......................................................... 414/936
See application file for complete search history.

(56) References Cited

U.S. PATENT DOCUMENTS

| | | | | |
|---|---|---|---|---|
| 4,806,057 A | * | 2/1989 | Cay ................... | H01L 21/67313 198/346.2 |
| 5,533,243 A | * | 7/1996 | Asano .................... | H01L 21/68 414/757 |

* cited by examiner

*Primary Examiner* — Ronald P Jarrett
(74) *Attorney, Agent, or Firm* — RABIN & BERDO, P.C.

(57) ABSTRACT

Provided is a wafer notch automated aligner, including a main body, a wafer rotation mechanism, and a wafer positioning mechanism. The main body has a wafer boat placement portion. The wafer rotation mechanism is disposed on the main body and includes a rotor, the rotor extends through the wafer boat placement portion, and an angle between an axis of the rotor and the main body is between 0° and 90°. The wafer positioning mechanism is disposed on the main body and includes a positioning member, the positioning member extends through the wafer boat placement portion, and an axis of the positioning member is parallel to the axis of the rotor. Hence, a plurality of wafers is disposed in a stepped arrangement by the inclined rotor and the inclined positioning member, and the wafer notch automated aligner can rotate wafers, align notches, and identify wafer identifications.

8 Claims, 14 Drawing Sheets

WAFER NOTCH AUTOMATED ALIGNER

CROSS-REFERENCE TO RELATED APPLICATION

This application claims the priority of Taiwanese patent application No. 110134428, filed on Sep. 15, 2021, which is incorporated herewith by reference.

BACKGROUND OF THE INVENTION

1. Field of the Invention

The present invention relates generally to a wafer notch automated aligner.

2. The Prior Arts

In hybrid floor shop production, wafers provided by different suppliers are often processed at the same time. If different batches of wafers all require resetting and training of optical character identification (OCR), the production yield will be greatly affected and the inspection process becomes a bottleneck on the production line. Therefore, wafer marking identification has become an important link in semiconductor packaging and testing plants, which can quickly distinguish wafers to improve management efficiency and reduce the risk of wafer mixed up or loss.

The manual wafer notch alignment device usually rotate hand wheel manually to drive a rotor, and the rotor further drives a plurality of wafers to rotate. The notches of the wafers are positioned on a positioning member to achieve functions such as wafer rotation, notch alignment, and marking identification. However, manual operation is time-consuming and laborious, and the torque is hard to control, which easily causes wafer shaking and damage. Furthermore, the rotor is parallel to the main body, so that the heights of the wafers on the rotor are the same, causing the marking of each wafer to be blocked by other wafers and affecting the efficiency of marking identification.

The electric wafer notch alignment device replaces the hand wheel with a driving device, which realizes the effect of automatic rotation of the rotor, saves time and effort, and effectively controls the rotation torque, so that the wafer is less prone to shaking and damage. Furthermore, the electric wafer notch alignment device can sequentially raise the wafers by a lifting device to prevent the marking of each wafer from being blocked by other wafers, thereby improving the efficiency of marking identification.

However, the conventional electric wafer notch alignment device has the following problems: first, the cost of installing the lifting device is high, and the volume is large and heavy; second, the power cord needs to be plugged into the mains to supply sufficient power, and cannot move at will; third, the mains is alternating current, high energy consumption, unstable output, and there is a risk of leakage and electromagnetic interference; fourth, the heat dissipation effect is poor.

In addition, manual and electric wafer notch alignment devices have the following common problems: first, the distance between the rotor and the positioning member is fixed, which cannot be applied to wafers of different sizes; second, the particles in the surrounding environment cannot be removed, thus the particles may adhere to the surface of the wafer, and the particles will affect the yield of the subsequent process of the wafer.

SUMMARY OF THE INVENTION

A primary objective of the present invention is to provide a wafer notch automated aligner, which can arrange a plurality of wafers in a stepped manner by means of an inclined rotor and positioning parts, preventing the marking of the wafers from being blocked, and achieving rotating wafers, notch alignment and marking identification functions.

Another objective of the present invention is to provide a wafer notch automated aligner, capable of controlling the rotation of the rotor by a single driving device to achieve the above-mentioned effect.

Another objective of the present invention is to provide a wafer notch automated aligner, which can be powered by a DC portable power supply.

Another objective of the present invention is to provide a wafer notch automated aligner, which can be applied to wafers of different sizes.

Another objective of the present invention is to provide a wafer notch automated aligner, which can remove particles in the surrounding environment of the wafer boat and has a good heat dissipation effect.

In order to achieve the foregoing objectives, the present invention provides a wafer notch automated aligner, which includes a main body, a wafer rotation mechanism, and a wafer positioning mechanism; the main body has a wafer boat placement portion; the wafer rotation mechanism is disposed on the main body and includes a rotor, the rotor extends through the wafer boat placement portion, and forms an angle between an axis of the rotor and the main body greater than 0° and less than 90°; the wafer positioning mechanism is disposed on the main body and includes a positioning member, the positioning member extends through the wafer boat placement portion, and an axis of the positioning member is parallel to the axis of the rotor.

In a preferred embodiment, the wafer rotation mechanism includes a driving device, the driving device is close to a first side of the wafer boat placement portion, and a driving shaft of the driving device is connected to a first end of the rotor; wherein, the wafer positioning mechanism includes a base, disposed on the main body and close to a first side of the wafer boat placement portion, and a first end of the positioning member is connected to the base; and the wafer notch automated aligner further includes a power supply device and a control device, the power supply device is disposed on the main body, and the control device is disposed on the main body and is electrically connected to the driving device and the power supply device; the power supply device provides power to the control device, and the control device controls the driving shaft of the driving device to drive the rotor to rotate.

In a preferred embodiment, the wafer rotation mechanism further includes a moving device, the moving device is disposed on the main body and is close to the first side of the wafer boat placement portion, the driving device is disposed on the moving device, and the control device is electrically connected to the moving device, the moving device controls the driving device to move toward or away from the positioning member to adjust the distance between the rotor and the positioning member.

In a preferred embodiment, the base includes a second fixing seat and a plate body, the second fixing seat is disposed on the main body and is close to the first side of the wafer boat placement portion, the plate body is disposed on the second fixing seat, and an axis of the plate body is parallel to the axis of the rotor; the plate body is disposed with a plurality of positioning holes; the positioning holes are different height positions and have different distances from the rotor; the first end of the positioning member selectively passes through one of the positioning holes to adjust the distance between the rotor and the positioning member.

In a preferred embodiment, the wafer rotation mechanism includes a first support, the first support is disposed on the main body, is close to a second side of the wafer boat placement portion, and supports a second end of the rotor; and wherein, the wafer positioning mechanism includes a second support, the second support is disposed on the main body, is close to the second side of the wafer boat placement portion, and supports a second end of the positioning member.

In a preferred embodiment, the first support can adjust the angle between the axis of the rotor and the main body by adjusting the height or by adjusting the distance to the driving device; and wherein, the second support can adjust the angle between the axis of the positioning member and the main body by adjusting the height or by adjusting the distance to the base.

In a preferred embodiment, the base includes a second fixing seat and a plate body, the second fixing seat is disposed on the main body and is close to the first side of the wafer boat placement portion, the plate body is pivoted on the second fixing seat, and the first end of the positioning member is connected to the plate body, and the plate body can rotate with respect to the second fixing seat to adjust the angle between the axis of the positioning member and the main body.

In a preferred embodiment, the driving device is a DC stepper motor, and the power supply device is a DC portable power supply.

In a preferred embodiment, the main body has a plurality of air inlets and a plurality of air outlets, the air inlets communicate with the inside of the main body, and the air outlets communicate with the inside of the main body; and the wafer notch automated aligner further includes at least one air extraction device, at least one air extraction device is disposed inside the main body and located on one side of the air inlets, the control device is electrically connected to at least one air extraction device, and the at least one air extraction device is used to guide outside air through the air inlets to enter the main body and exit through the air outlet holes.

In a preferred embodiment, the wafer notch automated aligner further includes a first image capturing device and a second image capturing device; wherein, the first image capturing device is disposed on the main body and is close to the first side of the wafer boat placement portion, is electrically connected to the control device, and is used to capture images of the markings of the wafers from the front of the plurality of wafers; and wherein, the second image capture device is disposed on the main body and is close to a third side or a fourth side of the wafer boat placement portion, is electrically connected to the control device, and is used to capture images of the markings of the wafers from the side surfaces of the wafers.

The effect of the present invention is that the present invention can present a plurality of wafers in a stepped distribution by means of inclined rotors and positioning members, prevent the marking of each wafer from being blocked by other wafers, and can further achieve the functions of rotating wafers, notch alignment and marking identification without additional lifting devices, and is low cost, small size, and light weight.

Furthermore, the present invention can control the rotation of the rotor by a single driving device to achieve the effects of wafer rotation, notch alignment and marking identification, and thus has the advantages of power saving, small size, light weight and easy movement.

In addition, the present invention can supply the required power by the DC portable power supply, does not require the power cord to be plugged into the mains, is easy to move, and the DC portable power supply has the advantages of low power consumption, stable output, no leakage risk, and low electromagnetic interference.

Moreover, the present invention can adjust the distance between the rotor and the positioning member to provide the bottom of the wafers of different sizes contacting the rotor and the positioning member to achieve the effect of being suitable for wafers of different sizes.

In addition, the present invention can guide the external air to pass through the air inlets, the inside of the main body, and then discharged from the air outlets through the air extraction device, so as to remove particles in the surrounding environment of the wafer boat and provide a good heat dissipation effect.

BRIEF DESCRIPTION OF THE DRAWINGS

The present invention will be apparent to those skilled in the art by reading the following detailed description of a preferred embodiment thereof, with reference to the attached drawings, in which.

DETAILED DESCRIPTION OF THE PREFERRED EMBODIMENT

Figure 1:
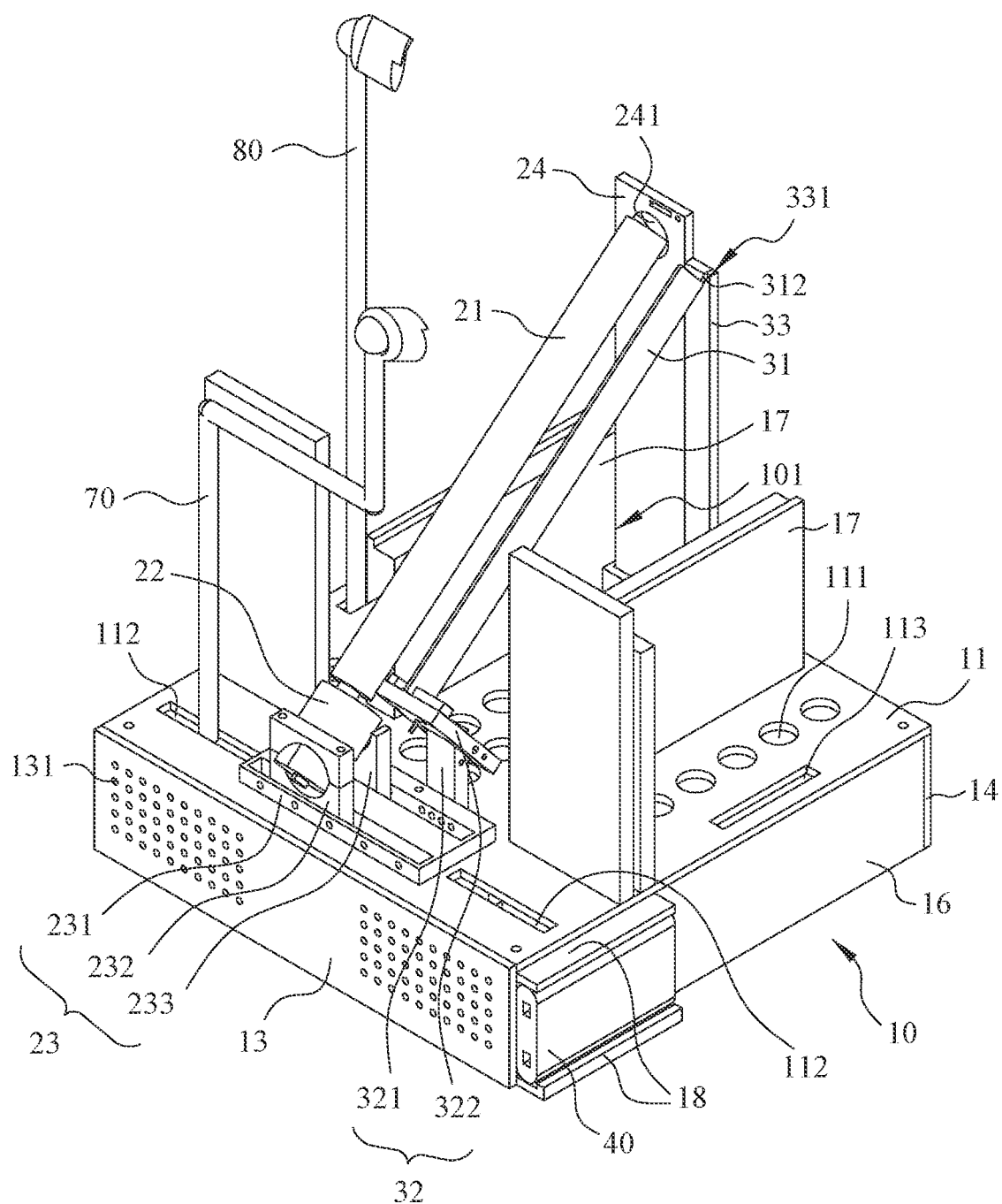
FIG. 1 is a perspective view of the first embodiment of the present invention.

The accompanying drawings are included to provide a further understanding of the invention, and are incorporated in and constitute a part of this specification. The drawings illustrate embodiments of the invention and, together with the description, serve to explain the principles of the invention.

As shown in FIGS. 1-6, the present invention provides a wafer notch automated aligner, which includes a main body 10, a wafer rotation mechanism 20, and a wafer positioning mechanism 30. The main body 10 has a wafer boat placement portion 101. The wafer rotation mechanism 20 is disposed on the main body 10 and includes a rotor 21 extending through the wafer boat placement portion 101. An angle θ1 is formed between an axis 211 of the rotor 21 and the main body 10, and is greater than 0° and less than 90°. In other words, the rotor 21 is inclined with respect to the main body 10. The wafer positioning mechanism 30 is disposed on the main body 10 and includes a positioning member 31 extending through the wafer boat placement portion 101, and an axis 311 of the positioning member 31 is parallel to the axis 211 of the rotor 21. In other words, the positioning member 31 is inclined with respect to the main body 10, and an angle θ2 is formed between the axis 311 of the positioning member 31 and the main body 10, and is equal to the angle θ1 between the axis 211 of the rotor 21 and the main body 10.

Figure 7:
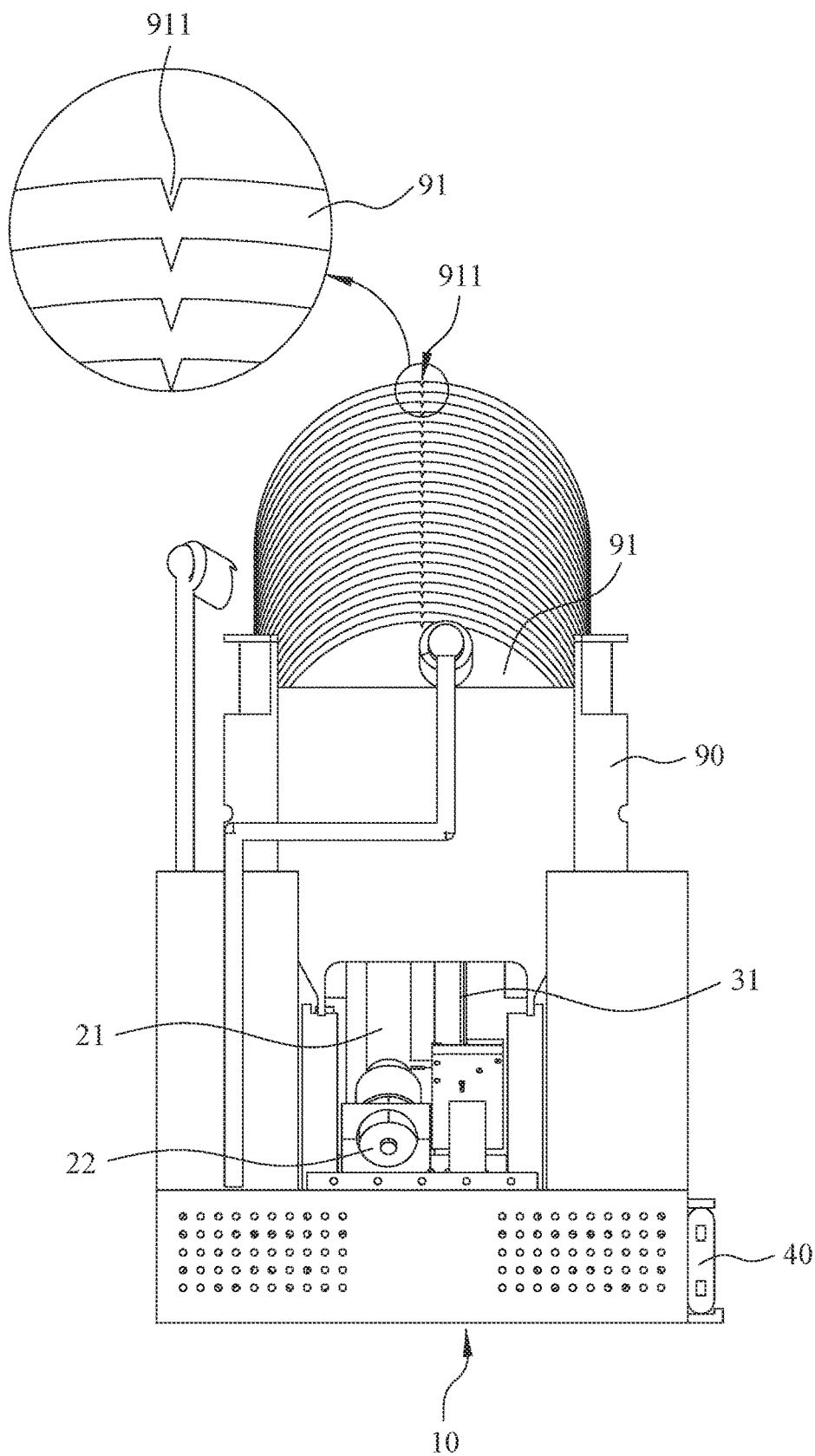
FIG. 7 is a schematic view of the wafer boat placed on the wafer boat placement portion of the present invention.

As shown in FIG. 7, a plurality of wafers 91 of the same size are placed in a wafer boat 90, and the edge of each wafer 91 has a notch 911; the wafer boat 90 is placed on the wafer boat placement portion 101, and the bottom of the wafers 91 contacts the rotor 21 and the positioning member 31. Because the rotor 21 is inclined with respect to the main body 10, the rotor 21 can elevate the wafers 91 to different heights and present a stepped distribution, and the top of the front side of each wafer 91 can be exposed without being blocked by other wafers 91.

Figure 8:
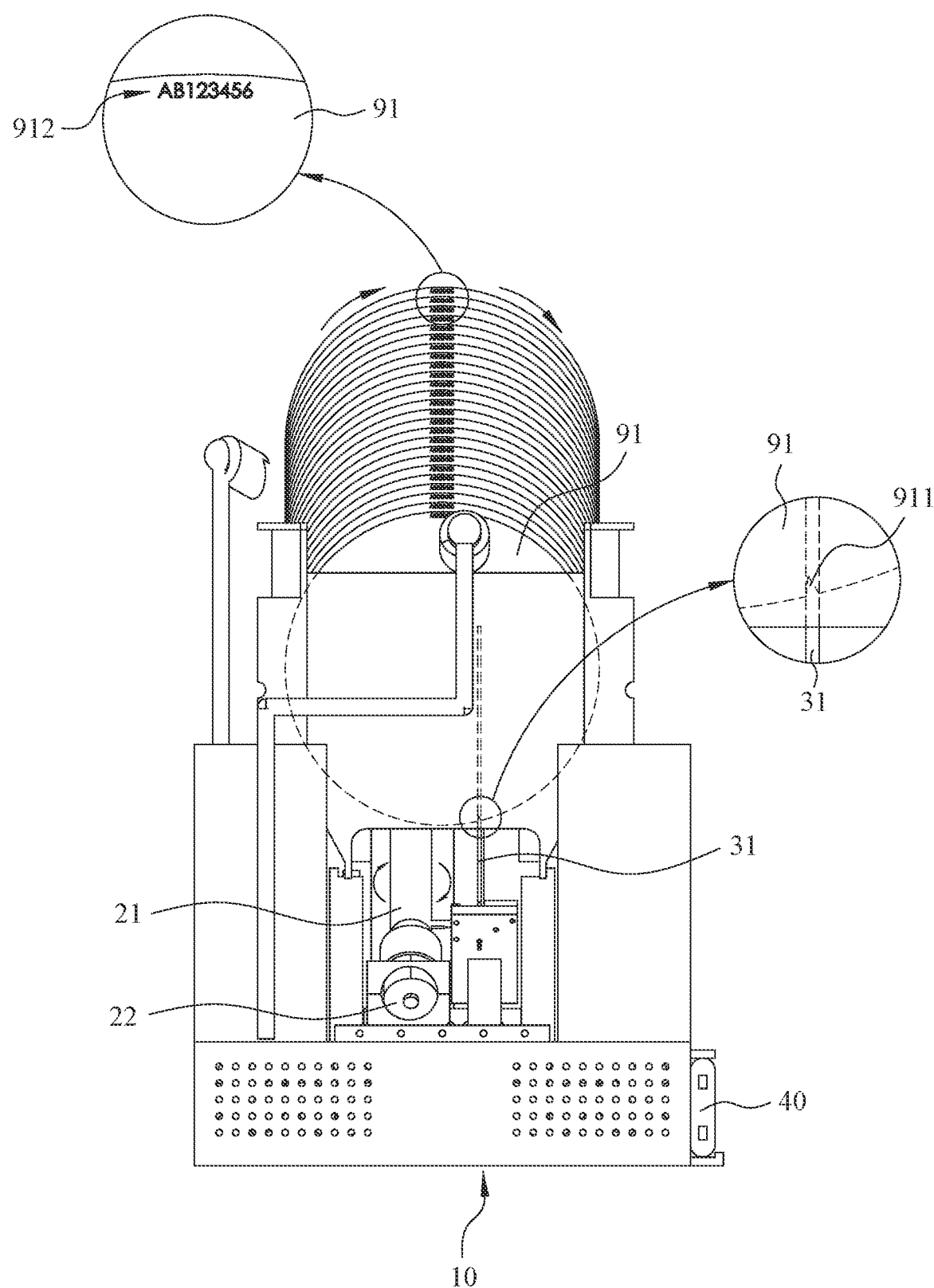
FIG. 8 is a schematic view of the present invention aligning the notches of a plurality of wafers and the marking being on the top of the wafers.

As shown in FIG. 8, the rotor 21 drives the wafers 91 to rotate until the notches 911 of the wafers 91 are positioned on the positioning member 31. At this point, the markings 912 on the front side of the wafers 91 are aligned and exactly on the top of the wafers 91. Therefore, the marking 912 of each wafer 91 can be exposed to the outside and will not be blocked by other wafers 91, so that the marking 912 of the wafers 91 can be recognized easily.

Figure 3:
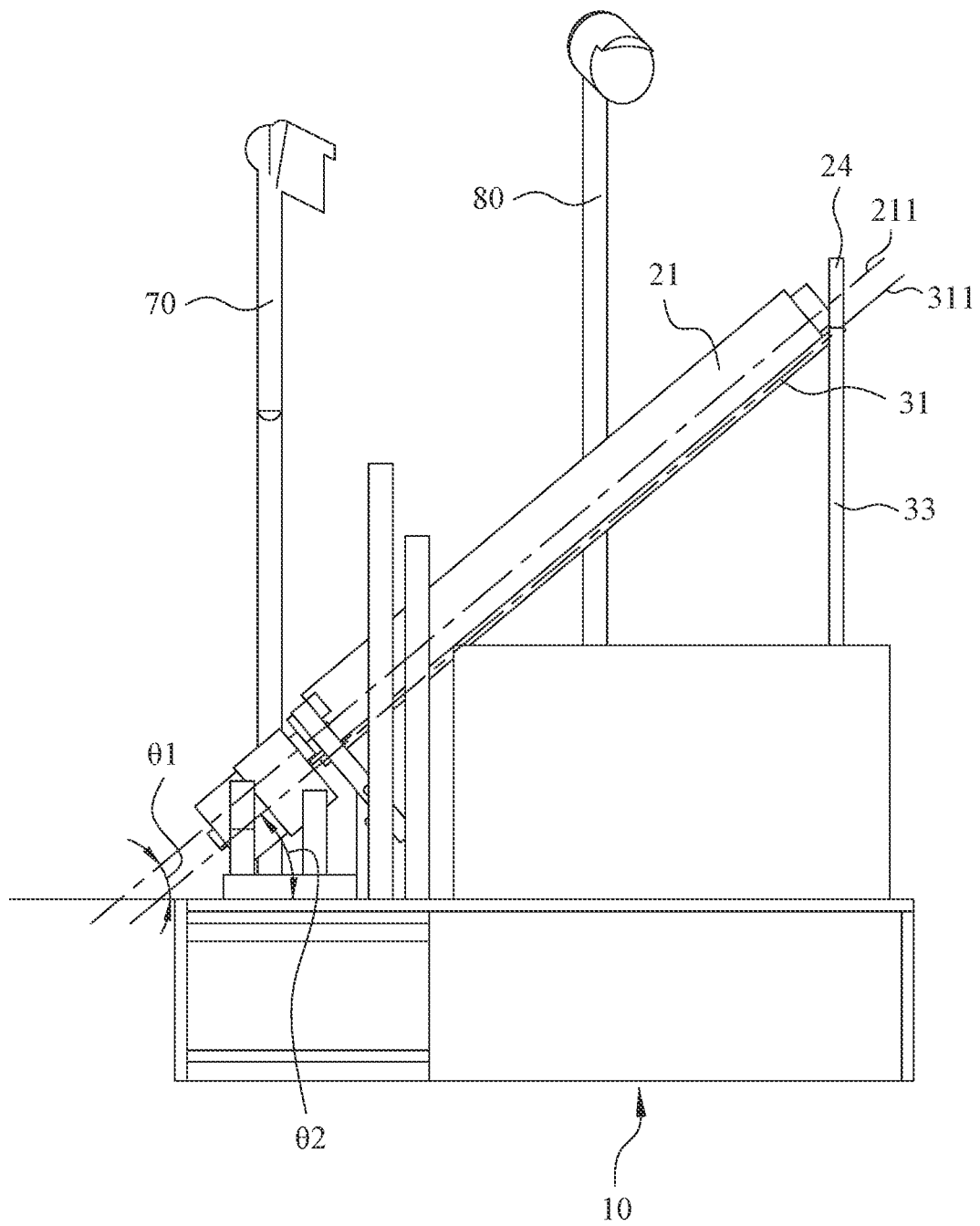
FIG. 3 is a front view of the first embodiment of the present invention.

As shown in FIG. 3, the angle θ1 between the axis 211 of the rotor 21 and the main body 10 is between 30° and 40°. This angle range can provide a plurality of eight-inch wafers 91 with the marking 912 exposed and will not be blocked by other 8-inch wafers 91.

As such, the present invention can present the wafers 91 in a stepped arrangement by the inclined rotor 21 and the positioning member 31, prevent the marking 912 of each wafer 91 from being blocked by other wafers 91, and can further achieve the wafer rotation, notch alignment and marking identification functions, without additional lifting device as well as low cost, small size and light weight.

Figure 2:
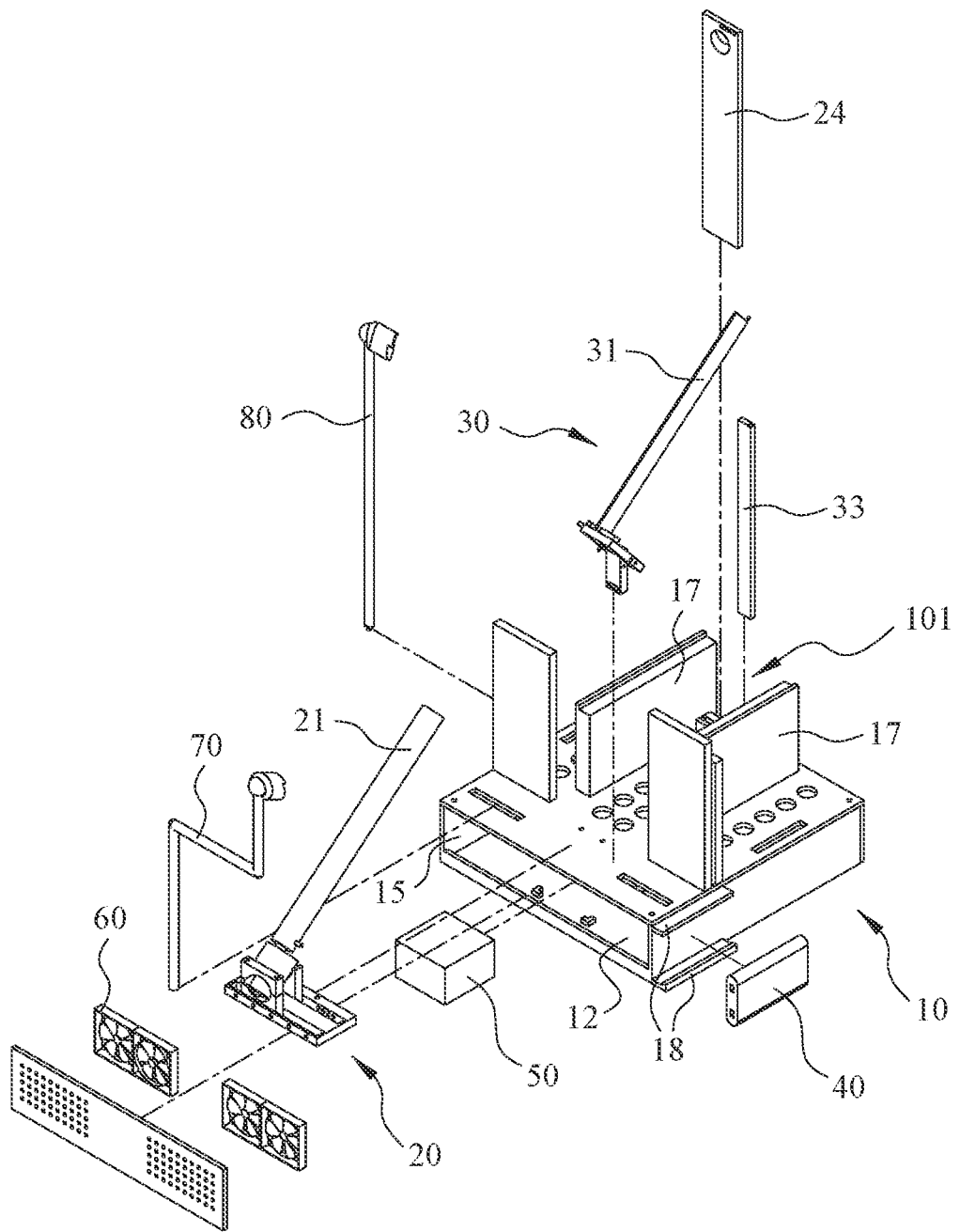
FIG. 2 is an exploded view of the first embodiment of the present invention.

Specifically, as shown in FIGS. 1 and 2, in the first embodiment, the main body 10 includes a top plate 11, a bottom plate 12, a first side plate 13, a second side plate 14, a third side plate 15, a fourth side plate 16, two partitions 17, and a mounting seat 18. The first side plate 13 and the second side plate 14 are located opposite to each other, and the third side plate 15 and the fourth side plate 16 are located opposite to each other. The partitions 17 are disposed on the top plate 11 and form a wafer boat placement portion 101 together with the top plate 11, and the mounting seat 18 is disposed on the third side plate 15. The side of the wafer boat placement portion 101 near the first side plate 13 is defined as a first side, the side of the wafer boat placement portion 101 near the second side plate 14 is defined as a second side, the side of the wafer boat placement portion 101 near the third side plate 15 is defined as a third side, and the side of the wafer boat placement portion 101 near the fourth side plate 16 is defined as a fourth side. As shown in FIGS. 1 and 2, in the first embodiment, the wafer rotation mechanism 20 includes a driving device 22, which is to located at the first side of the wafer boat placement portion 101, and a driving shaft 221 of the driving device 22 (see FIG. 9) is connected to a first end of the rotor 21. As shown in FIGS. 1 and 2, in the first embodiment, the wafer positioning mechanism 30 includes a base 32, which is disposed on the top plate 11 and is located at the first side of the wafer boat placement portion 101. A first end of the positioning member 31 is connected to the base 32. As shown in FIGS. 1 and 2, in the first embodiment, the wafer notch automated aligner of the present invention further includes a power supply device 40 and a control device 50; the power supply device 40 is disposed on the mounting seat 18; the control device 50 is disposed inside the main body 10, located at the first side plate 13, and is electrically connected to the driving device 22 and the power supply device 40. The power supply device 40 provides power to the control device 50, and the control device 50 controls the driving shaft 221 of the driving device 22 to rotate the rotor 21.

Thereby, the wafer notch automated aligner of the present invention can control the rotation of the rotor 21 by a single driving device 22 to achieve the functions of wafer rotation, notch alignment and marking identification, and thus has the advantages of power saving, small size, and light weight, as well as easy to move and other advantages.

Preferably, the driving device 22 is a DC stepping motor, and the DC stepping motor can achieve the following functions: first, the rotation angle of the rotor 21 is accurately controlled, so that the notches 911 of the wafers 91 can be accurately aligned; second, to provide the rotor 21 with a stable rotation speed and torque, so that the rotor 21 can rotate the wafers 91 smoothly, and avoid shaking and damage to the wafers 91.

Preferably, because the wafer notch automated aligner of the present invention is power-saving, the power supply device 40 is a DC mobile power supply that can supply the required power. Thereby, the wafer notch automated aligner of the present invention does not require a power cord to be plugged into the mains and is easy to move. Also, the DC mobile power supply has the advantages of low power consumption, stable output, no leakage risk, and low electromagnetic interference.

As shown in FIGS. 1-6, in the first embodiment, the wafer rotation mechanism 20 further includes a moving device 23, which is disposed on the main body 10 and located at the first side of the wafer boat placement portion 101. The driving device 22 is installed on the moving device 23. The control device 50 is electrically connected to the moving device 23, and the moving device 23 controls the driving device 22 to move toward or away from the positioning member 31 to adjust the distance between the rotor 21 and the positioning member 31.

Figure 9:
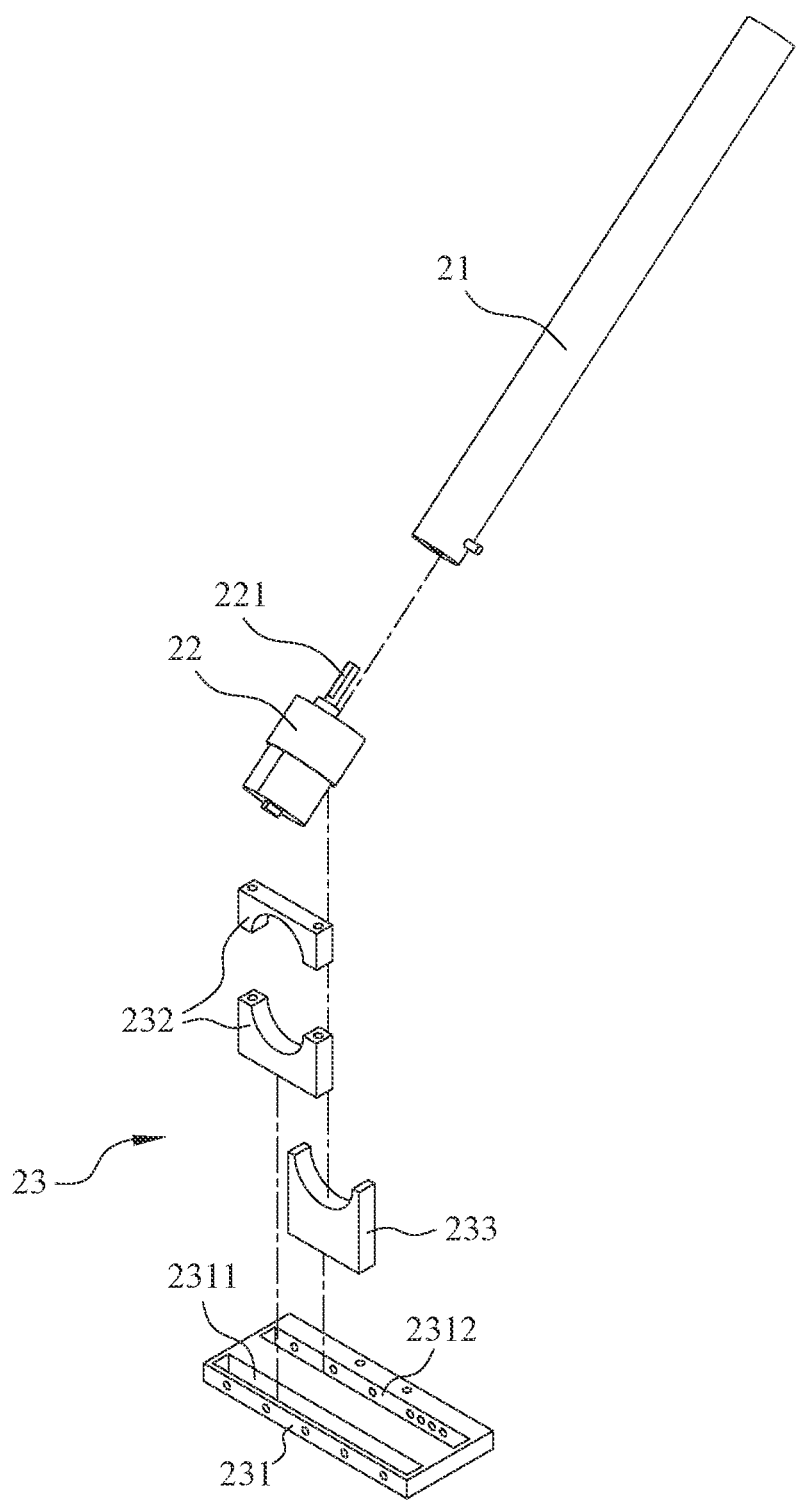
FIG. 9 is an exploded view of the wafer rotation mechanism of the present invention.

Specifically, as shown in FIGS. 1, 2 and 9, the moving device 23 includes a first fixing seat 231, a first sliding block 232 and a second sliding block 233. The first fixing seat 231 is disposed on the top plate 11 and is located at the first side of the wafer boat placement portion 101. The first fixing seat 231 is disposed with a first sliding groove 2311 and a second sliding groove 2312. The first sliding block 232 is slidably disposed in the first sliding groove 2311, and the second sliding block 233 is slidably disposed in the second sliding groove 2312. A first end of the driving device 22 is disposed on the first sliding block 232, the second sliding block 233 supports a second end of the driving device 22, and an axis of the driving device 22 is parallel to the axis 211 of the rotor 21. The control device 50 controls the first sliding block 232 and the second sliding block 233 to move synchronously, so that the first sliding block 232 and the second sliding block 233 synchronously control the driving device 22 to move closer to or away from the positioning member 31 to adjust the distance between the rotor 21 and the positioning member 31.

Figure 10:
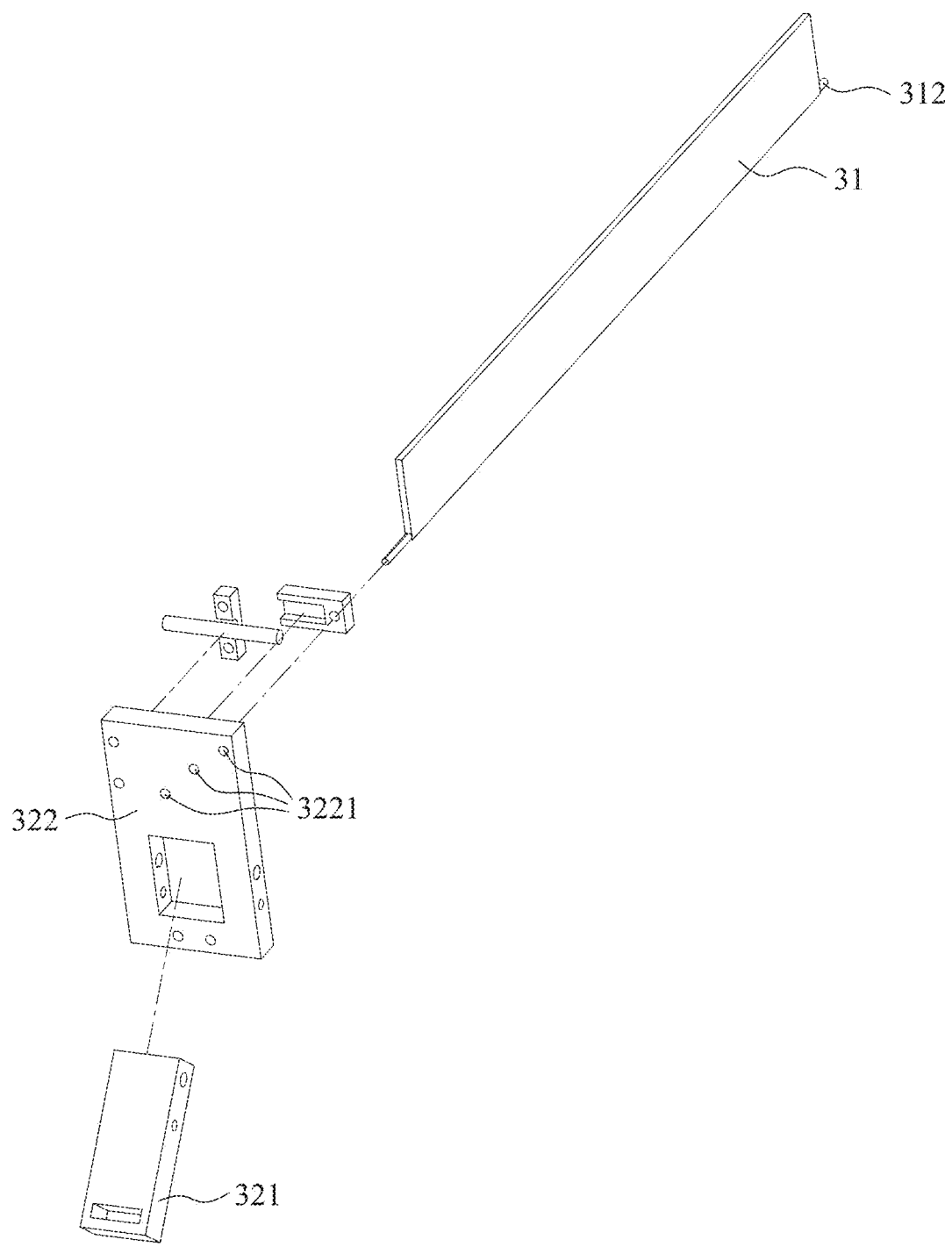
FIG. 10 is an exploded view of the wafer positioning mechanism of the present invention.

As shown in FIGS. 1, 2 and 10, in the first embodiment, the base 32 includes a second fixing seat 321 and a plate body 322. The second fixing seat 321 is disposed on the top plate 11 and is located at the first side of the wafer boat placement portion 101, the plate body 322 is disposed on the second fixing seat 321, and an axis of the plate body 322 is parallel to the axis 211 of the rotor 21. The plate body 322 is disposed with a plurality of positioning holes 3221, and the positioning holes 3221 are at different height positions and have different distances from the rotor 21. The first end of the positioning member 31 selectively penetrates one of the positioning holes 3221 to adjust the distance between the rotor 21 and the positioning member 31.

It depends on the distance between the rotor 21 and the positioning member 31 whether the bottom of wafers 91 of different sizes can contact the rotor 21 and the positioning member 31. Take 12-inch, 8-inch, and 6-inch wafers 91 as an example. Because the 12-inch wafer 91 has the largest diameter, the 8-inch wafer 91 has the medium diameter, and the 6-inch wafer 91 has the smallest diameter, the 12-inch wafer 91 has the smallest diameter, the distance between the rotor 21 and the positioning member 31 required for the 12-inch wafer 91 is the largest, the distance between the rotor 21 and the positioning member 31 required for the 8-inch wafer 91 is medium, and the distance between the rotor 21 and the positioning member 31 required for the 6-inch wafer 91 is the smallest. Thereby, the wafer notch automated aligner of the present invention can adjust the distance depends on the distance between the rotor 21 and the positioning member 31 by moving the driving device 22 with the moving device 23 or by the first end of the positioning member 31 penetrating different positioning holes 3221, so as to provide the bottom of the wafers 91 of different sizes to contact the rotor 21 and the positioning member 31 to achieve the applicability to wafers 91 of different sizes.

As shown in FIGS. 1-3, in the first embodiment, the wafer rotation mechanism 20 includes a first support 24, which is disposed on the top plate 11, and is located at the second side of the wafer boat placement portion 101. The first support 24 supports a second end of the rotor 21. More precisely, the first support 24 is disposed with a through hole 241, and the second end of the rotor 21 is located in the through hole 241. Therefore, the first support 24 can provide sufficient supporting force to support the rotor 21, and prevent the rotor 21 from falling or even breaking under the weight of the wafers 91, so that the angle θ1 between the axis 211 of the rotor 21 and the main body 10 can remain unchanged.

As shown in FIGS. 1-3, in the first embodiment, the wafer positioning mechanism 30 includes a second support 33. The second support 33 is disposed on the top plate 11 and is located at the second side of the wafer boat placement portion 101. The second support 33 supports a second end of the positioning member 31. More precisely, a groove 331 is disposed on the top of the second support 33, a protrusion 312 is protruded from the second end of the positioning member 31, and the protrusion 312 is located in the groove 331. Therefore, the second supporting member 33 can provide sufficient supporting force to support the positioning member 31, and prevent the positioning member 31 from falling or even breaking under the weight of the wafers 91, so that the angle of the included angle θ2 between the axis 311 of the positioning member 31 and the main body 10 can be maintained unchanged.

Figure 6:
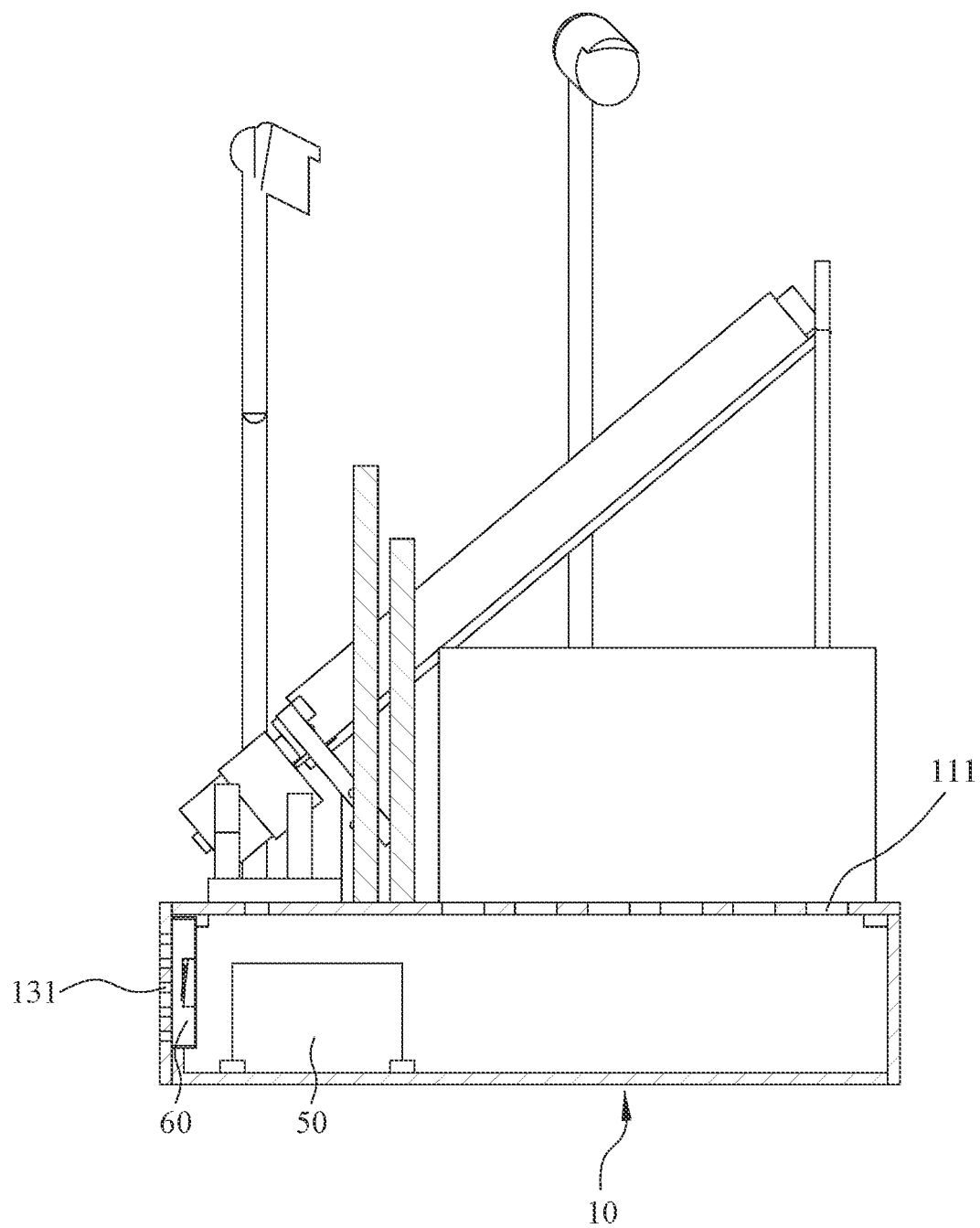
FIG. 6 is a cross-sectional view of the first embodiment of the present invention.

As shown in FIGS. 1, 2 and 6, in the first embodiment, the top plate 11 is provided with a plurality of air inlets 111, and the first side plate 13 is provided with a plurality of air outlets 131. The air inlets 111 communicate with the inside of the main body 10. The air outlets 131 also communicate with the inside of the main body 10. The wafer notch automated aligner of the present invention further includes a plurality of air extraction devices 60. As illustrated in FIG. 2 and also is known in the art, each of the air extraction devices 60 may be an exhaust fan. The air extraction devices 60 are arranged inside the main body 10 and are respectively located on one side of the air outlets 131, and the control device 50 is electrically connected to the air extraction devices 60.

Figure 11:
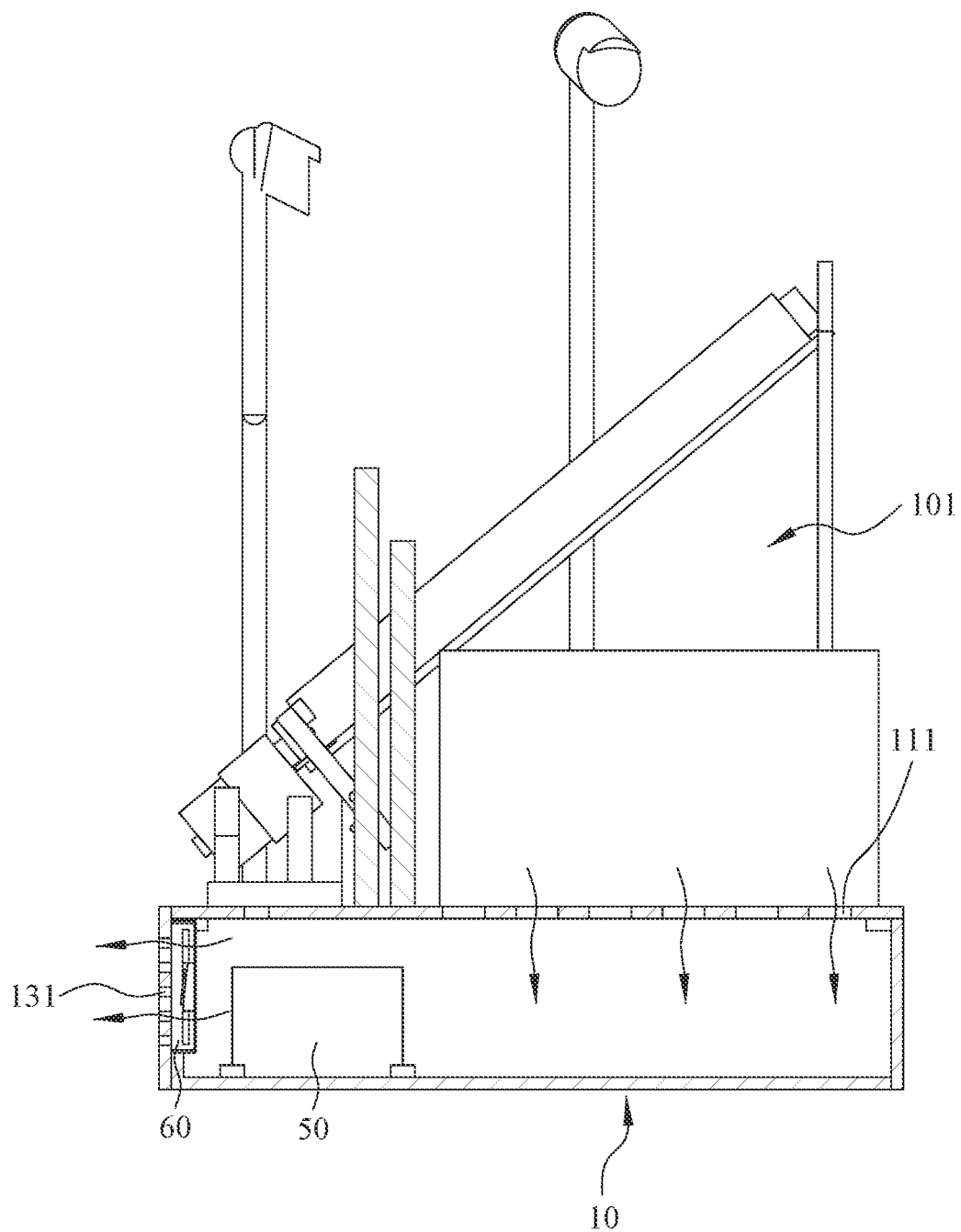
FIG. 11 is a schematic view of external air passing through the air inlets, air extraction device, and air outlets of the present invention.

As shown in FIG. 11, the air extraction devices 60 are used to guide the external air into the main body 10 through the air inlets 111 and to be discharged outside through the air outlets 131. Specifically, the outside air in the surrounding environment of the wafer boat placement portion 101 is actually mixed with many particles (not shown), and these particles will enter the main body 10 along with the outside air through the air inlets 111 and discharged through the air outlets 131 to the outside to remove particles from the surrounding environment of the wafer boat placement portion 101, so as to prevent these particles from adhering to the surface of the wafers 91, and improve the yield of the wafers 91 in subsequent processes. It is worth noting that the heat generated during the operation of the control device 50 can also be discharged outward along with the flow of external air to achieve the effect of heat dissipation.

Figure 12:
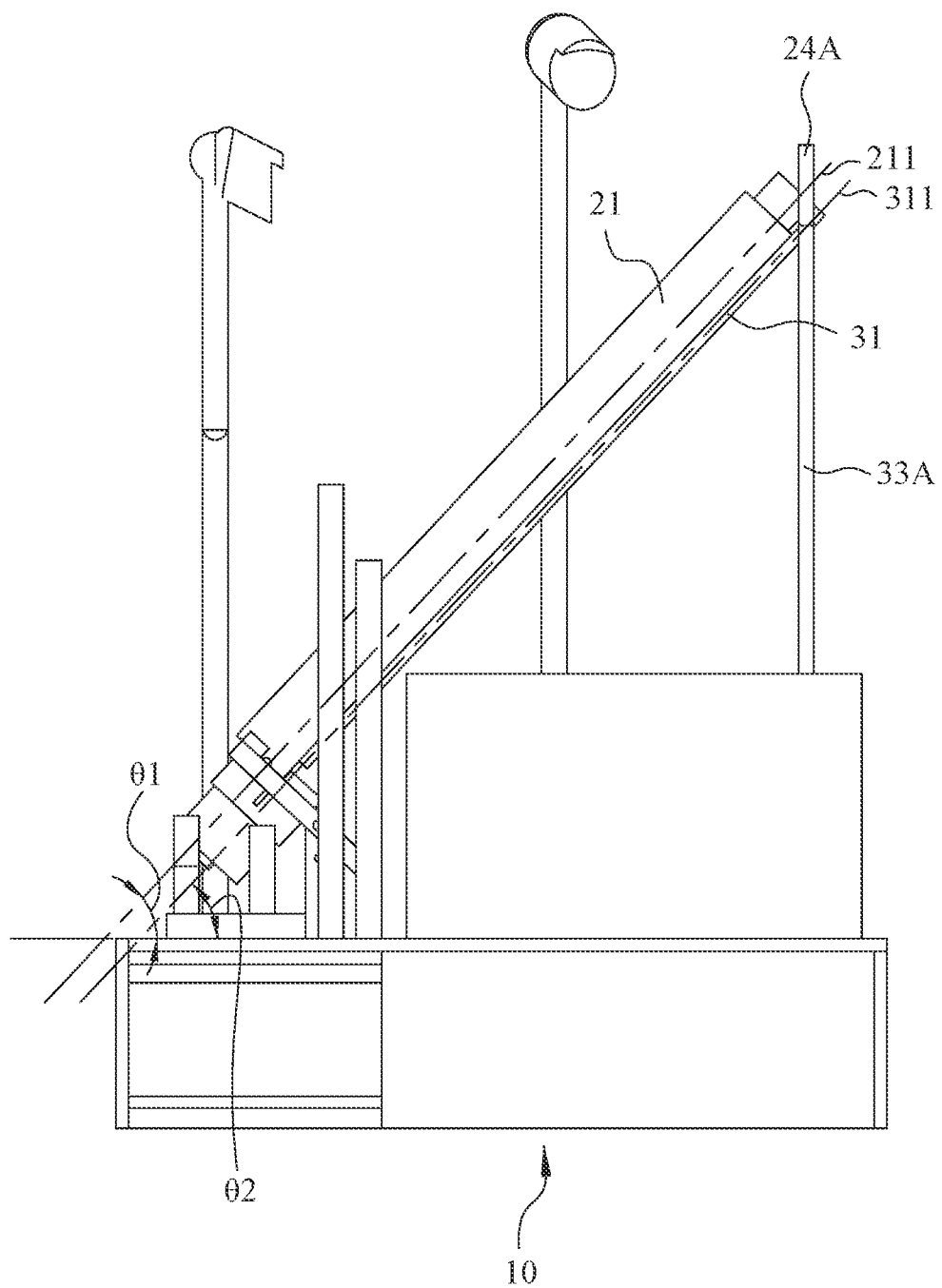
FIG. 12 is a schematic view of the height increase of the first support and the second support of the present invention.

Preferably, the height of the first support 24 can be adjusted in order to adjust the angle θ1 between the axis 211 of the rotor 21 and the main body 10. Similarly, the height of the second support 33 can be adjusted in order to adjust the angle θ2 between the axis 311 of the positioning member 31 and the main body 10. Specifically, the height of the first support 24 and the second support 33 shown in FIG. 3 is low, so that the angle θ1 between the axis 211 of the rotor 21 and the main body 10 is small, and the angle θ2 between the axis of the positioning member 31 and the main body 10 is small. The height of the first support 24A and the second member 33A shown in FIG. 12 is higher so that the angle θ1 between the axis 211 of the rotor 21 and the main body 10 is larger, and the angle θ2 between the axis of the positioning member 31 and the main body 10 is larger.

It depends on whether the angle θ1 between the axis 211 of the rotor 21 and the main body 10 is appropriate to determine whether the markings 912 of the wafers 91 of different sizes can be exposed without being blocked by other wafers 91. Take 12-inch, 8-inch and 6-inch wafers 91 as an example. Because the 12-inch wafer 91 has the largest diameter, the 8-inch wafer 91 has the medium diameter, and the 6-inch wafer 91 has the smallest diameter, therefore, the following configuration is more appropriate: the angle θ1 between the axis 211 of the rotor 21 and the main body 10 required by the 12-inch wafer 91 must be smallest, the angle θ1 between the axis 211 of the rotor 21 and the main body 10 required by the 8-inch wafer 91 must be medium, and the angle θ1 between the axis 211 of the rotor 21 and the main body 10 required by the 6-inch wafer 91 must be largest. Thereby, the wafer notch automated aligner of the present invention can adjust the angle θ1 between the axis 211 of the rotor 21 and the main body 10 to an appropriate angle by replacing the first supports 24 and 24A of different heights, so that the markings 912 of the wafers 91 of different sizes can be exposed and will not be blocked by other wafers 91.

Similarly, it depends on whether the angle θ2 between the axis 311 of the positioning member 31 and the main body 10 is appropriate to determine whether the markings 912 of the wafers 91 of different sizes can be exposed without being blocked by other wafers 91. Take 12-inch, 8-inch and 6-inch wafers 91 as an example. Because the 12-inch wafer 91 has the largest diameter, the 8-inch wafer 91 has the medium diameter, and the 6-inch wafer 91 has the smallest diameter, therefore, the following configuration is more appropriate: the angle θ2 between the axis 311 of the positioning member 31 and the main body 10 required by the 12-inch wafer 91 must be smallest, the angle θ2 between the axis 311 of the positioning member 31 and the main body 10 required by the 8-inch wafer 91 must be medium, and the angle θ2 between the axis 311 of the positioning member 31 and the main body 10 required by the 6-inch wafer 91 must be largest. Thereby, the wafer notch automated aligner of the present invention can adjust the angle θ2 between the axis 311 of the positioning member 31 and the main body 10 to an appropriate angle by replacing the second supports 33 and 33A of different heights, so that the markings 912 of the wafers 91 of different sizes can be exposed and will not be blocked by other wafers 91.

Preferably, as shown in FIGS. 1, 2 and 10, the plate body 322 is pivoted on the second fixing seat 321, and the first end of the positioning member 31 is connected to the plate body 322. The plate body 322 can rotate with respect to the second fixing seat 321 to adjust the angle θ2 between the axis 311 of the positioning member 31 and the main body 10.

In other embodiments, the first support 24 can also adjust the distance to the driving device 22 to adjust the angle θ1 between the axis 211 of the rotor 21 and the main body 10; similarly, the second support 33 can also adjust the distance to the base 32 to adjust the angle θ2 between the axis 311 of the positioning member 31 and the main body 10.

As shown in FIGS. 1-6, in the first embodiment, the wafer notch automated aligner of the present invention further includes a first image capturing device 70 and a second image capturing device 80. As illustrated in FIG. 2 and also is known in the art, each of the first image capturing device 70 and the second image capturing device 80 may be a camera. The first image capturing device 70 is disposed on the top plate 11, located at the first side of the wafer boat placement portion 101, electrically connected to the control device 50, and used to capture the markings 912 of the wafers 91 from the front of the wafers 91. The second image capturing device 80 is disposed on the top plate 11, located at the third side of the wafer boat placement portion 101, electrically connected to the control device 50, and used to capture the markings 912 of the wafers 91 from the sides of the wafers 91. After the control device 50 receives the image of the marking 912 of the wafer 91, the image will be further transmitted to a marking identification module (not shown) for marking identification. In other embodiments, the second image capturing device 80 can also be located at the fourth side of the wafer boat placement portion 101 with the same effect.

More precisely, because the wafers 91 are of various sizes and the surfaces of the wafers 91 will reflect light, it is necessary for the first image capturing device 70 and the second image capturing device 80 to capture the markings 912 of the wafers 91 from different angles to ensure that at least one of the first image capturing device 70 and the second image capturing device 80 will capture the image of the marking 912 of the wafer 91, with good focus, quantity and quality of the image, so that the marking identification module can receive quality images to accurately identify the marking 912 of the wafer 91.

Figure 4:
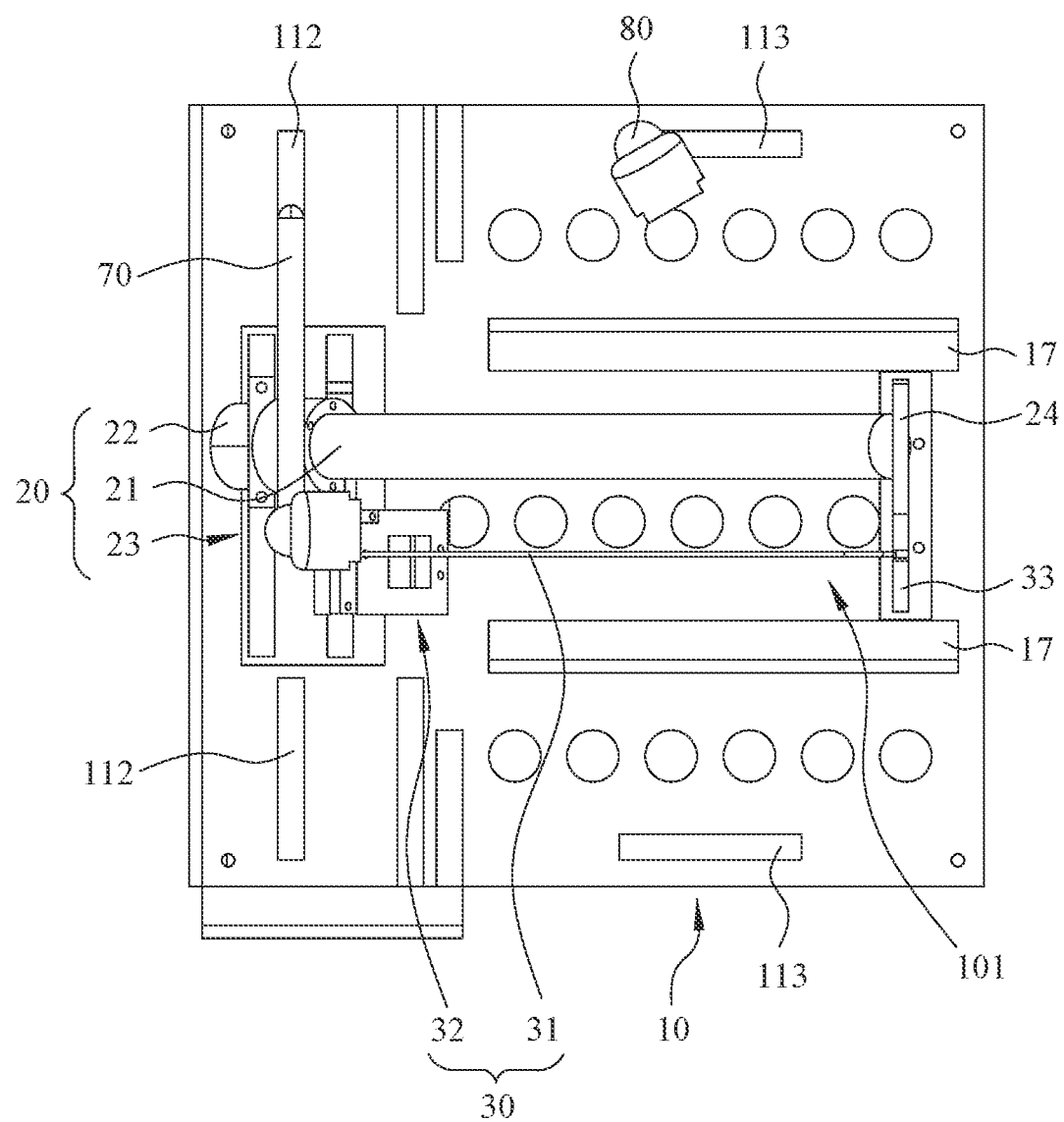
FIG. 4 is a top view of the first embodiment of the present invention.
Figure 5:
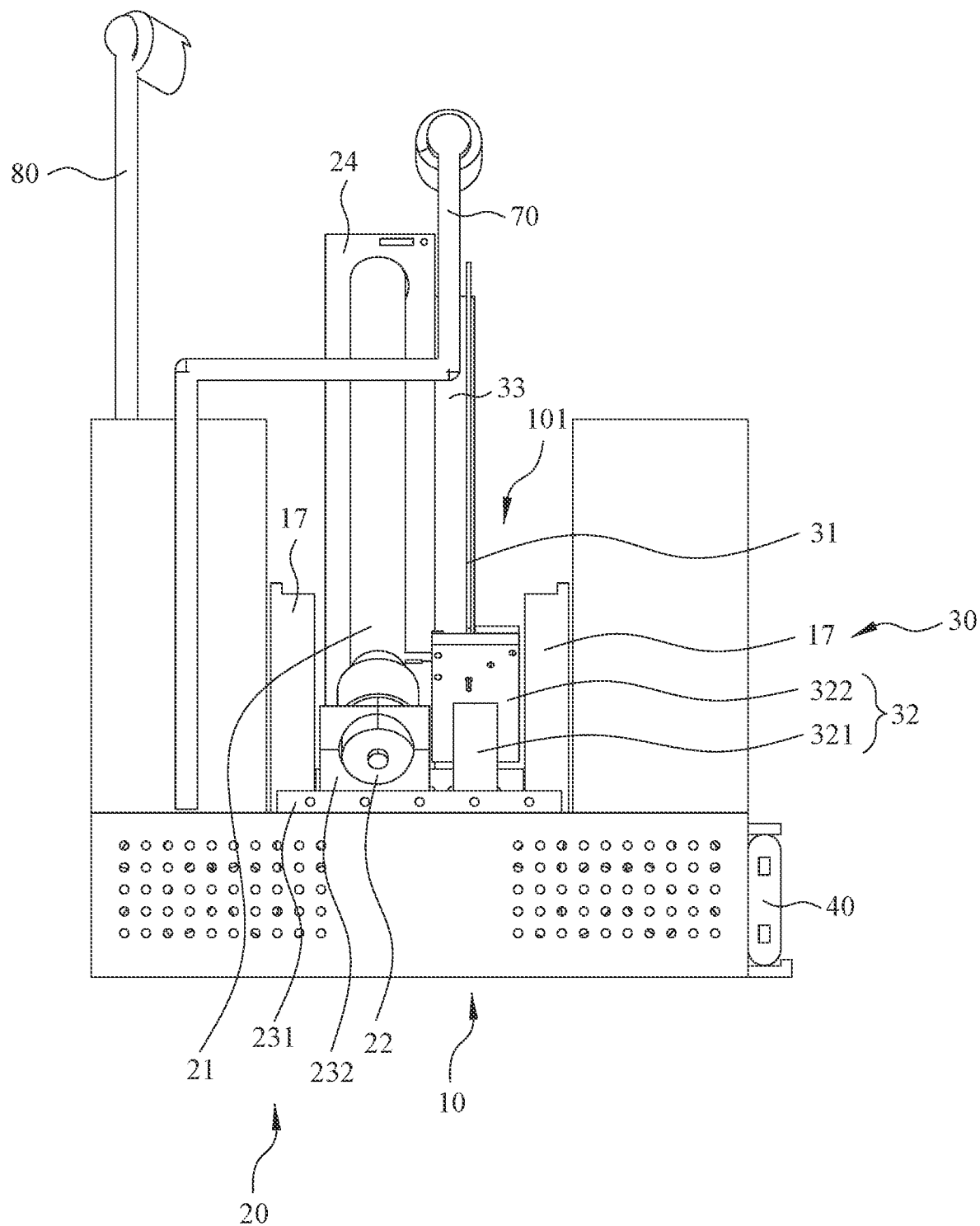
FIG. 5 is a side view of the first embodiment of the present invention.

As shown in FIGS. 1, 2 and 4, in the first embodiment, two third sliding grooves 112 and two fourth sliding grooves 113 are disposed on the top plate 11. The two third sliding grooves 112 are located at the first side of the wafer boat placement portion 101 and are located on two sides of the first fixing seat 231. The two fourth sliding grooves 113 are respectively located at the third side and the fourth side of the wafer boat placement portion 101. The first image capturing device 70 is slidably disposed on one of the two third sliding grooves 112, and the second image capturing device 80 is slidably disposed on one of the two fourth sliding grooves 113. The first image capturing device 70 can move along one of the two third sliding grooves 112 to adjust position with respect to the wafers 91, so as to obtain a front view of the wafers 91 at a better angle to capture the images of the marking 912 of the wafers 91. The second image capturing device 80 can move along one of the two fourth sliding grooves 113 to adjust position with respect to the wafers 91, so as to obtain a side view of the wafers 91 at a better angle to capture the images of the marking 912 of the wafers 91.

Figure 13:
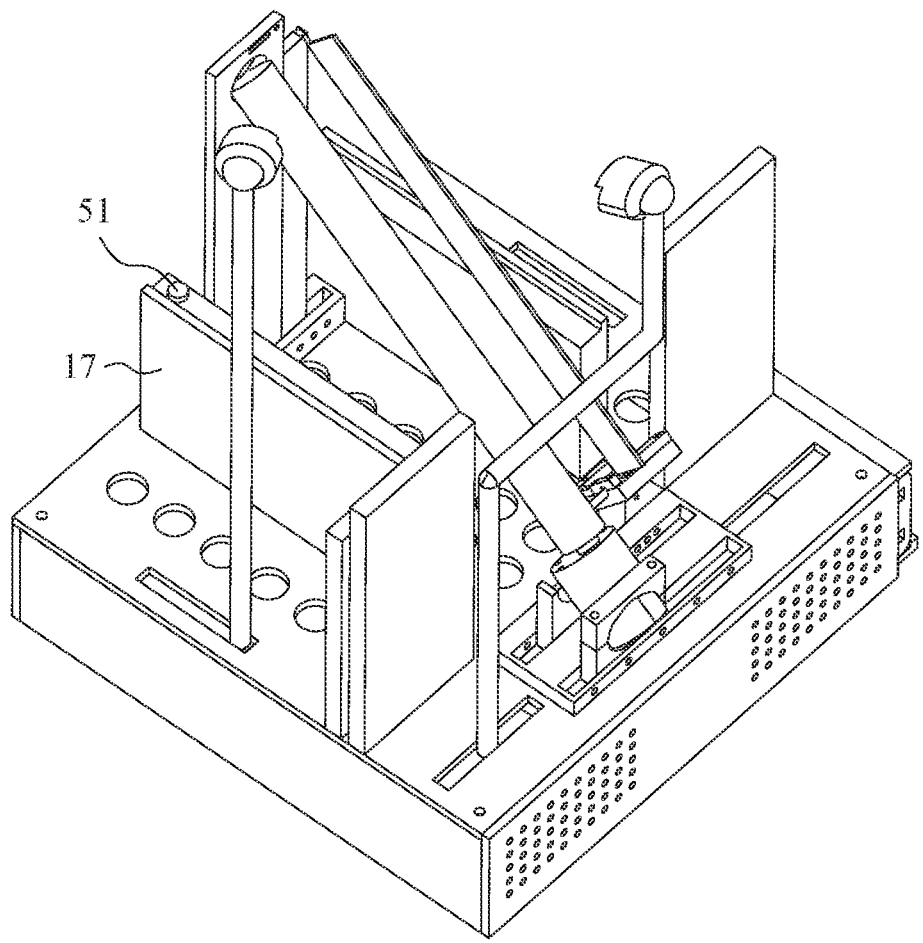
FIG. 13 is a perspective view of the second embodiment of the present invention.
Figure 14:
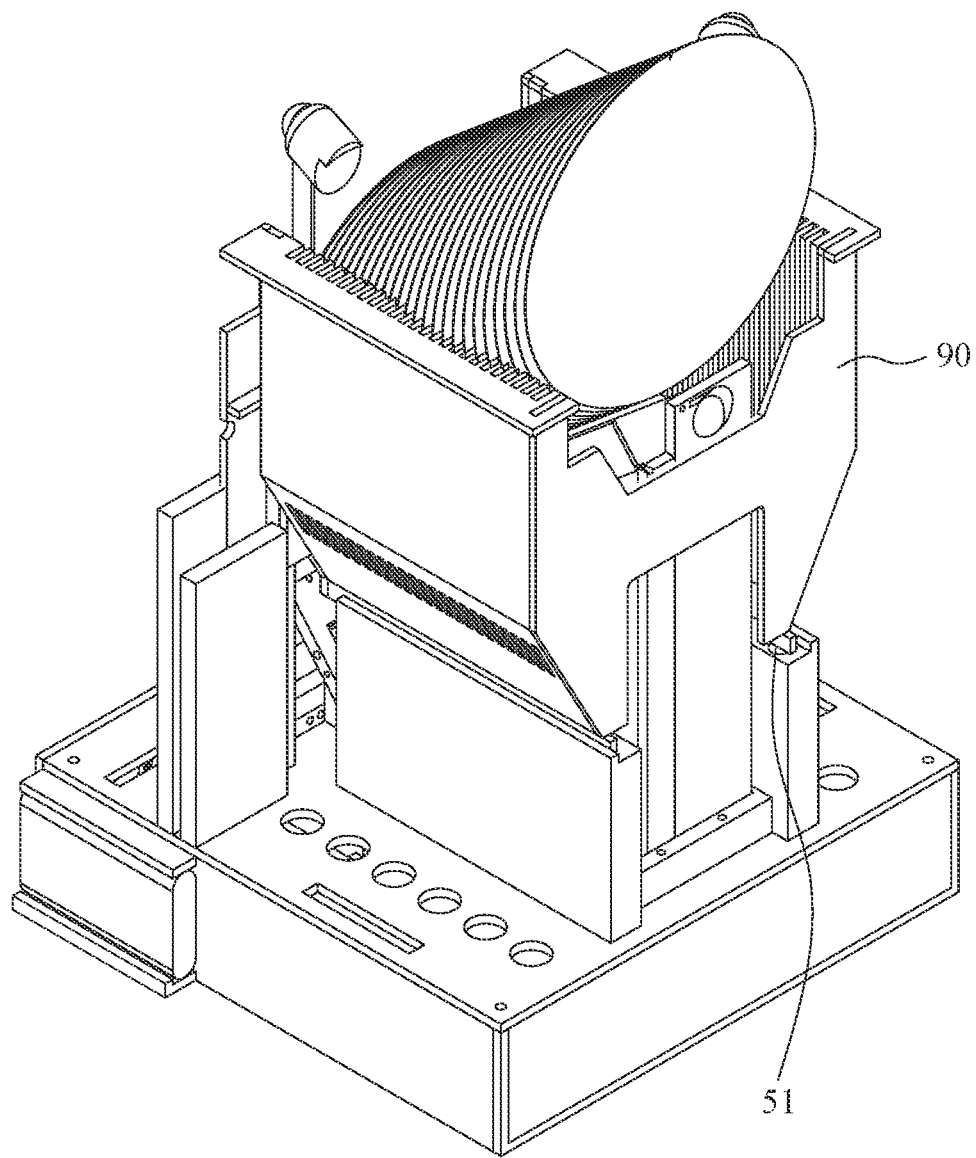
FIG. 14 is a schematic view of the wafer boat pressing the pressure switch of the present invention.

Refer to FIGS. 13 and 14. FIG. 13 is a perspective view of the second embodiment of the present invention. FIG. 14 shows a schematic view of the wafer boat 90 pressing the pressure switch of the present invention. As shown in FIG. 13, the difference between the second embodiment and the first embodiment is that the control device 50 includes a pressure switch 51 and is disposed on one of the partitions 17. As shown in FIG. 14, the wafer boat 90 presses the pressure switch 51 to activate the driving device 22, the moving device 23, the air extraction device 60, the first image capturing device 70 and the second image capturing device 80. After the wafer boat 90 is removed from the wafer boat placement portion 101, the pressure switch 51 is pushed by an elastic member (not shown) to reset.

Although the present invention has been described with reference to the preferred embodiments thereof, it is apparent to those skilled in the art that a variety of modifications and changes may be made without departing from the scope of the present invention which is intended to be defined by the appended claims.

What is claimed is:

1. A wafer notch automated aligner, comprising:
a main body, having a wafer boat placement portion;
a wafer rotation mechanism, disposed on the main body and includes a rotor, a driving device and a first support, the rotor extending through the wafer boat placement portion, and forming an angle between an axis of the rotor and the main body greater than 0° and less than 90°, the driving device being located at a first side of the wafer boat placement portion, a driving shaft of the driving device being connected to a first end of the rotor, the first support being disposed on the main body, being located to a second side of the wafer boat placement portion, and supporting a second end of the rotor; and
a wafer positioning mechanism, disposed on the main body and comprising a positioning member, a base and a second support, the positioning member extending through the wafer boat placement portion, and an axis of the positioning member being parallel to the axis of the rotor, the base being disposed on the main body and located at the first side of the wafer boat placement portion, a first end of the positioning member being connected to the base, the second support being disposed on the main body, being located to the second side of the wafer boat placement portion, and supporting a second end of the positioning member;

a power supply device, disposed on the main body; and a control device, disposed on the main body and being electrically connected to the driving device and the power supply device, wherein the power supply device provides power to the control device, and the control device controls the driving shaft of the driving device to drive the rotor to rotate.

2. The wafer notch automated aligner according to claim 1, wherein the wafer rotation mechanism further comprises a moving device, the moving device is disposed on the main body and is located at the first side of the wafer boat placement portion, the driving device is disposed on the moving device, and the control device is electrically connected to the moving device, the moving device controls the driving device to move toward or away from the positioning member to adjust the distance between the rotor and the positioning member.

3. The wafer notch automated aligner according to claim 1, wherein the base comprises a second fixing seat and a plate body, the second fixing seat is disposed on the main body and is located at the first side of the wafer boat placement portion, the plate body is disposed on the second fixing seat, and an axis of the plate body is parallel to the axis of the rotor; the plate body is disposed with a plurality of positioning holes; the positioning holes are different height positions and have different distances from the rotor; the first end of the positioning member selectively passes through one of the positioning holes to adjust the distance between the rotor and the positioning member.

4. The wafer notch automated aligner according to claim 1, wherein the first support can adjust the angle between the axis of the rotor and the main body by adjusting the height or by adjusting the distance to the driving device; and wherein, the second support can adjust the angle between the axis of the positioning member and the main body by adjusting the height or by adjusting the distance to the base.

5. The wafer notch automated aligner according to claim 1, wherein the base comprises a second fixing seat and a plate body, the second fixing seat is disposed on the main body and is located at the first side of the wafer boat placement portion, the plate body is pivoted on the second fixing seat, and the first end of the positioning member is connected to the plate body, and the plate body can rotate with respect to the second fixing seat to adjust the angle between the axis of the positioning member and the main body.

6. The wafer notch automated aligner according to claim 1, wherein the driving device is a DC stepper motor, and the power supply device is a DC portable power supply.

7. The wafer notch automated aligner according to claim 1, wherein the main body has a plurality of air inlets and a plurality of air outlets, the air inlets communicate with the inside of the main body, and the air outlets communicate with the inside of the main body; and the wafer notch automated aligner further comprises at least one exhaust fan, the at least one exhaust fan is disposed inside the main body and located on one side of the air inlets, the control device is electrically connected to the at least one exhaust fan, and the at least one exhaust fan is used to guide outside air through the air inlets to enter the main body and exit through the air outlet holes.

8. The wafer notch automated aligner according to claim 1, further comprising:

a first camera and a second camera; wherein, the first camera is disposed on the main body and located at the first side of the wafer boat placement portion, electrically connected to the control device, and used to capture images of markings of the wafers from the front of the plurality of wafers; and wherein, the second camera is disposed on the main body and located at a third side or a fourth side of the wafer boat placement portion, electrically connected to the control device, and used to capture images of the markings of the wafers from the side surfaces of the wafers.

* * * * *